United States Patent
Duggal et al.

(10) Patent No.: US 6,777,724 B2
(45) Date of Patent: Aug. 17, 2004

(54) LIGHT-EMITTING DEVICE WITH ORGANIC LAYER DOPED WITH PHOTOLUMINESCENT MATERIAL

(75) Inventors: Anil Raj Duggal, Niskayuna, NY (US); Alok Mani Srivastava, Niskayuna, NY (US); Steven Jude Duclos, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 69 days.

(21) Appl. No.: 10/298,202

(22) Filed: Nov. 15, 2002

(65) Prior Publication Data

US 2003/0094626 A1 May 22, 2003

Related U.S. Application Data

(62) Division of application No. 09/713,394, filed on Nov. 16, 2000, now Pat. No. 6,515,314.

(51) Int. Cl.[7] .............................................. H01L 31/072
(52) U.S. Cl. ..................... 257/184; 257/87; 257/89; 257/96; 257/100; 257/103; 313/501; 313/503; 313/506; 313/507
(58) Field of Search ......................... 257/184, 87, 89, 257/90, 96, 98, 100, 103, 40, 13; 313/501, 503, 506, 507

(56) References Cited

U.S. PATENT DOCUMENTS

| | | | |
|---|---|---|---|
| 4,769,292 A | * | 9/1988 | Tang et al. ............... 428/690 |
| 5,126,214 A | * | 6/1992 | Tokailin et al. ........... 428/690 |
| 5,141,671 A | * | 8/1992 | Bryan et al. ............ 252/301.16 |
| 5,294,870 A | | 3/1994 | Tang et al. |
| 5,326,692 A | * | 7/1994 | Brinkley et al. ............... 435/6 |
| 5,683,823 A | * | 11/1997 | Shi et al. .................... 428/690 |
| 5,717,289 A | | 2/1998 | Tanaka |
| 5,813,753 A | | 9/1998 | Vriens et al. |
| 5,943,354 A | | 8/1999 | Lawandy |
| 5,999,880 A | | 12/1999 | Okada et al. |
| 6,023,371 A | | 2/2000 | Onitsuka et al. |
| 6,121,726 A | * | 9/2000 | Codama et al. ............. 313/504 |
| 6,252,254 B1 | | 6/2001 | Soules et al. |

* cited by examiner

Primary Examiner—Nathan J. Flynn
Assistant Examiner—Remmon R. Fordé
(74) Attorney, Agent, or Firm—Toan P. Vo; Patrick K. Patnode

(57) ABSTRACT

A light-emitting device includes an anode, a cathode, and at least one organic electroluminescent ("EL") material positioned between the anode and the cathode. Nanoparticles of at least one photoluminescent material are dispersed in the organic EL material. The organic EL material emits a first electromagnetic ("EM") radiation having a first spectrum in response to an applied electrical field. The PL material absorbs a portion of the first EM radiation emitted by the organic EL material and emits a second EM radiation having a second spectrum. A plurality of the light-emitting devices are arranged on a transparent substrate to provide a panel display or a lighting source.

15 Claims, 6 Drawing Sheets

LIGHT-EMITTING DEVICE WITH ORGANIC LAYER DOPED WITH PHOTOLUMINESCENT MATERIAL

This application is a division of U.S. patent application Ser. No. 09/713,394, filed on Nov. 16, 2000, now U.S. Pat. No. 6,515,314. The Applicants hereby claim the benefit of U.S. patent application Ser. No. 09/713,394 under 35 U.S.C. § 120.

BACKGROUND OF THE INVENTION

1. Field of the Invention

The present invention relates generally to lighting applications and, more particularly, to a light-emitting device having at least one organic luminescent layer doped with at least one photoluminescent material.

2. Description of the Related Art

Light-emitting diodes have gained increasing interest as sources for lighting. These devices are classified into inorganic light-emitting diodes ("LEDs") and organic light-emitting devices ("OLEDs"). The technology for LEDs has progressed significantly, and typical semiconductor-based LEDs now can emit a range of colors in the green-to-red wavelengths. LEDs emitting blue or violet light are rare. Commercial blue LEDs are based on gallium nitride (GaN) or indium gallium nitride (InGaN). LEDs have been coated with phosphor particles to produce a mixture of the primary colors, resulting in white light. However, the manufacture of these devices is still complex and costly.

On the contrary, OLEDs offer the promise of low drive voltage requirement and simple manufacture. The simplest OLEDs typically consist of three layers deposited on a transparent substrate: an anode layer, an active layer of electroluminescent ("EL") organic material, and a cathode layer. The EL organic material is either a low molecular weight organic material or a polymeric material having unsaturated bonds. Individual OLEDs typically emit broad-spectrum lights. To achieve a white light, prior-art devices incorporate closely arranged OLEDs emitting blue, green, and red light. These color lights are mixed to produce white light. An alternate scheme to produce white light is set forth in U.S. Pat. No. 5,294,870 which describes an organic EL multicolor display device comprising an organic EL source emitting blue light with green- and red-emitting fluorescent materials applied to different subpixel areas. This device emits different colors from the different subpixel areas by color shifting with the green- and red-emitting fluorescent materials. However, the manufacture of such microdevices is complex and requires sophisticated technologies.

Another example of an OLED is described in Junji Kido et al., "Multilayer White Light-Emitting Organic Electroluminescent Device," 267 Science 1332–1334 (1995). This device includes three emitter layers with different carrier (or charge) transport properties, each emitting blue, green, or red light, which layers are used together to generate white light. However, the formation of successive layers requires a high degree of care so that the interfaces between the layers do not introduce unnecessary barriers to charge transport. In this device, the layers emitting the different colors typically degrade over time at different rates. Consequently, the color of light emitted from the device is likely to change over time. In addition, the uniformity of the light output over the emitting area of the device may be less than desirable because of imperfections at the interfaces between the layers.

Therefore, it is desirable to provide a light source based on organic EL materials that emits light at controllable wavelengths and is simple to manufacture. It is also desirable to use such light sources to produce white light.

BRIEF SUMMARY OF THE INVENTION

A light-emitting device of the present invention comprises an anode, a cathode, and at least one organic EL material that is in contact with the anode and the cathode. The anode and the cathode are electrically isolated from one another. The organic EL material emits electromagnetic ("EM") radiation having a first spectrum in response to an electrical voltage or an electrical field applied through the anode and the cathode. The electrical voltage or electrical field is applied by connecting the anode to a first electrical potential and connecting the cathode to a second electrical potential that is lower than the first. The organic EL material includes at least one photoluminescent ("PL") material dispersed therein that absorbs a portion of the EM radiation emitted by the organic EL material and emits EM radiation having a second spectrum. When the EM radiation has the wavelength range in the visible spectrum (i.e, from about 380 nm to about 770 nm) the terms "light" and "EM radiation" are used interchangeably hereinafter. The organic EL material is formed into a thin film that is disposed between an anode and a cathode of the light-emitting device. The preferred PL materials comprise inorganic phosphors in the form of nanoparticles. The term "nanoparticles" as used in the present disclosure means particles having the largest dimension less than about 100 nm. The preferred largest dimension for the nanoparticles is less than about 50 nm. The inorganic phosphor nanoparticles are dispersed in the organic EL material prior to film formation. The PL material absorbs EM radiation having a shorter wavelength and emits EM radiation having a longer wavelength. In this case, the PL material is said to perform a down-conversion of the EM radiation. Other PL materials may be chosen to absorb EM radiation having a longer wavelength and emit EM radiation having a shorter wavelength. In this case, the PL material is said to perform an up-conversion of the EM radiation. Thus, the choice of the organic EL material and the PL material provides a control over the color of light emitted by the OLED.

BRIEF DESCRIPTION OF THE DRAWINGS

Other features and advantages of the present invention will be apparent from the following detailed description of the preferred embodiments and the accompanying drawings in which the same numerals refer to like elements.

DETAILED DESCRIPTION OF THE INVENTION

Figure 1:
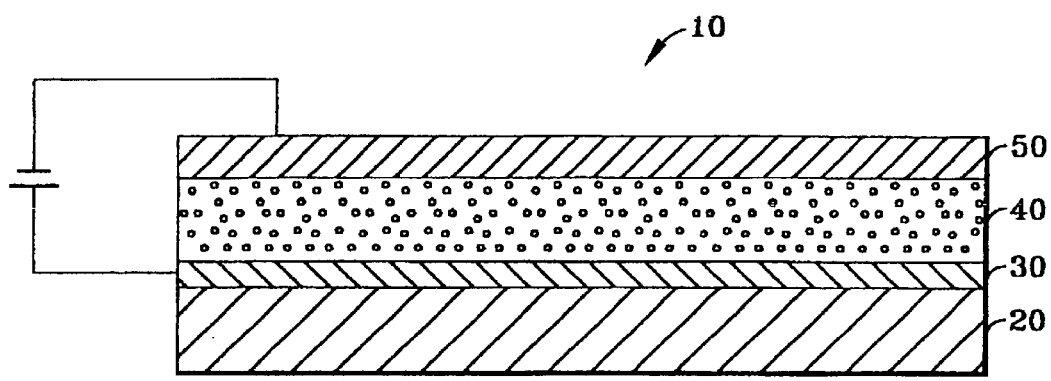
FIG. 1 is a schematic diagram of a three-layer organic light-emitting device of the present invention.

There has been an increasing need to have thin, flat, inexpensive, extended white light sources with a high color rendition index ("CRI") and a color temperature in the range of 3000–6500° K for general illumination applications. In addition, the demand for flat panel displays having full color and high resolution also increases significantly with the explosive growth of television, computer terminals, and portable electronic devices.

The present invention provides a light-emitting device that can emit light having a color temperature in the range of about 1000° K to over 10000° K, corresponding to red to blue color. A particular color temperature is achieved by the choice of the particular organic EL material and the phosphor materials.

According to another embodiment of the present invention, a plurality of the light-emitting devices of the present invention is incorporated in a substantially flat panel display or a large lighting device for illumination of an area.

The color temperature of a light source refers to the temperature of a blackbody source having the closest color match to the light source in question. The color match is typically represented and compared on a conventional CIE (Commission International de l'Eclairage) chromaticity diagram. See, for example, "Encyclopedia of Physical Science and Technology," Vol. 7, 230–231 (Robert A. Meyers (Ed.), 1987). Generally, as the color temperature increases, the light becomes bluer. As the color temperature decreases, the light appears redder.

The CRI is a measure of the degree of distortion in the apparent colors of a set of standard pigments when measured with the light source in question as opposed to a standard light source. The CRI can be determined by calculating the color shift; e.g., quantified as tristimulus values, produced by the light source in question as opposed to the standard light source. Typically, for color temperatures below 5000° K, the standard light source used is a blackbody of the appropriate temperature. For color temperatures greater than 5000° K, sunlight is typically used as the standard light source. Light sources having a relatively continuous output spectrum, such as incandescent lamps; typically have a high CRI, e.g. equal to or near 100. Light sources having a multi-line output spectrum, such as high pressure discharge lamps, typically have a CRI ranging from about 50 to 80. Fluorescent lamps typically have a CRI greater than about 60.

According to one embodiment of the present invention, the organic EL material emits EM radiation having a wavelength in the range from UV to blue light (i.e., from about 300 nm to about 500 nm) in response to an applied voltage or an applied electrical field, and the inorganic phosphors absorb EM radiation having a wavelength in the range of ultraviolet to blue light and emit light having a wavelength in the range of blue to red light (i.e., from about 400 nm to about 770 nm). The source for the applied voltage may be a direct current ("DC") source or an alternating current ("AC") source.

The organic EL film or layer of the present invention is typically disposed between an anode layer and a cathode layer of the light-emitting device. The multilayer assemblage of anode, organic EL film, and cathode is typically supported on a substantially transparent substrate, such as glass, quartz, or a substantially transparent polymeric material. The substrate allows at least 80%, preferably at least 95%, more preferably at least 99%, and most preferably at least 99.9%, light transmitted therethrough. Examples of polymeric materials suitable for use as the substrate are polycarbonate, silicone, polyacrylate, polyethylene terephthalate, and epoxy resins. One or more additional layers of other organic or metallic materials may be included between the anode and the cathode to increase the efficiency for injecting charges into or for carrying those charges to the active organic EL film. When an additional metallic film is used to facilitate the transport positive charges or holes to the active organic EL layer, their thickness is kept to a minimum, preferably less than 50 nm, so that light emitted from the organic layer can escape substantially unalterably. The thickness of any additional layer used to facilitate the transport of electrons to the active organic EL layer, on the other hand, may be larger as long as it is not excessive such that the layer presents an excessive barrier to the injection of electrons.

Exemplary embodiments of the present invention provide advantages over known devices. For example, the light emitted from the organic light emitting device is scattered because of the presence of the nanoparticles, and the light scattering provides improved uniformity in light output over the area of the light source. Also, because most phosphors are relatively stable over time, a light source according to exemplary embodiments of the invention has good color stability over time.

As examples of embodiments of the invention, the light source comprises an OLED that emits light in the blue or ultraviolet ("UV") spectral region (i.e., wavelengths in the range of about 300 nm to about 500 nm). FIG. 1 is a schematic diagram of the first preferred embodiment of the light-emitting device of the present invention. The OLED 10 comprises three layers: an anode layer 30, a layer of organic EL material 40, and a cathode layer 50. The assemblage of the layers is disposed on a substantially transparent substrate 20 such as glass, quartz, or a substantially transparent polymer. The substrate allows at least 80%, preferably at least 95%, more preferably at least 99%, and most preferably 99.9%, light transmitted therethrough. The polymer may be formed into a rigid or a flexible flat piece made of a polycarbonate, silicone, polyacrylate, polyethylene terephthalate, epoxy resin, or the like. However, in certain circumstances, it may be desirable to form the OLED on a curved substrate.

The anode layer 30 injects positive charge carriers (or holes) into the organic EL layer when an electrical voltage is applied across the OLED 10. The anode layer is preferably made of a metal having a high work function; e.g., greater than about 4.5 eV, preferably from about 4.5 eV to about 5.5 eV. Indium tin oxide ("ITO") is typically used for this purpose. The thickness of the ITO anode layer is typically in the range from about 50 nm to 400 nm, preferably from about 50 nm to about 200 nm. ITO is substantially transparent to light transmission and allows at least 80% light transmitted therethrough. Therefore, light emitted from the organic EL layer 40 can easily escape through the ITO anode without being seriously attenuated. Other materials suitable for use as the anode layer are tin oxide, indium oxide, zinc oxide, indium zinc oxide, and mixtures thereof.

The cathode layer 50 injects negative charge carriers (electrons) into the organic EL layer 40 when a voltage is applied across the OLED 10 and is selected from a material having a low work function; e.g, less than about 4 eV. Materials suitable for use as a cathode are K, Li, Na, Mg, La, Ce, Ca, Sr, Ba, Al, Ag, In, Sn, Zn, Zr, or mixtures thereof. Preferred materials for the manufacture of cathodes are Ag—Mg, Al—Li, In—Mg, and Al—Ca alloys. The thickness of the cathode layer is preferably kept in the range from about 50 nm to about 500 run, preferably from about 50 nm to about 200 nm.

The organic EL layer 40 serves as the transport medium for both holes and electrons. In this layer these excited species combine and drop to a lower energy level, concurrently emitting EM radiation in the visible range. The preferred organic EL materials are those capable of electroluminescing in the range of UV to blue light. More preferably, the organic materials electroluminesce in the wavelength range from about 300 nm to about 450 nm. The thickness of the organic EL layer 40 is preferably kept in the range of about 100 to about 300 nm. The organic EL material may be a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility. Suitable EL polymers are poly (N-vinylcarbazole) ("PVK", emitting violet-to-blue light in the wavelengths of about 380–500 nm); poly(alkylfluorene) such as poly(9,9-dihexylfluorene) (410–550 nm), poly (dioctylfluorene) (wavelength at peak EL emission of 436 nm), or poly[9,9-bis(3,6-dioxaheptyl)-fluorene-2,7-diyl] (400–550 nm); poly(praraphenylene) derivatives such as poly(2-decyloxy-1,4-phenylene) (400–550 nm). Mixtures of these polymers or copolymers based on one or more of these polymers and others may be used as long as the resulting polymeric material preferably emits blue light. For example, a copolymer of 2,7-dibromo-9,9-di-n-hexylfluorene and 9,10-dibromoanthracene emits light in the wavelength range of 400–525 nm.

Another class of suitable EL polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly (methylphenylsilane), and poly[bis(pbutylphenyl)silane] which are disclosed in H. Suzuki et al., "Near-Ultraviolet Electroluminescence From Polysilanes," 331 Thin Solid Films 64–70 (1998). These polysilanes emit light having wavelengths in the range from about 320 nm to about 420 nm.

Organic materials having molecular weight less than about 5000 that are made of a large number of aromatic units are also applicable. An example of such materials is 1,3,5-tris[N-(4-diphenylaminophenyl) phenylamino] benzene, which emits light in the wavelength range of 380–500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis[2,6-di (tbutyl)phenoxide] or scandium-(4-methoxy-picolylmethylketone)-bis(acetylacetonate), which emits in the range of 420–433 nm. The preferred organic EL materials are those emit light predominantly below 450 nm such as PVK or polysilanes.

Figure 2:
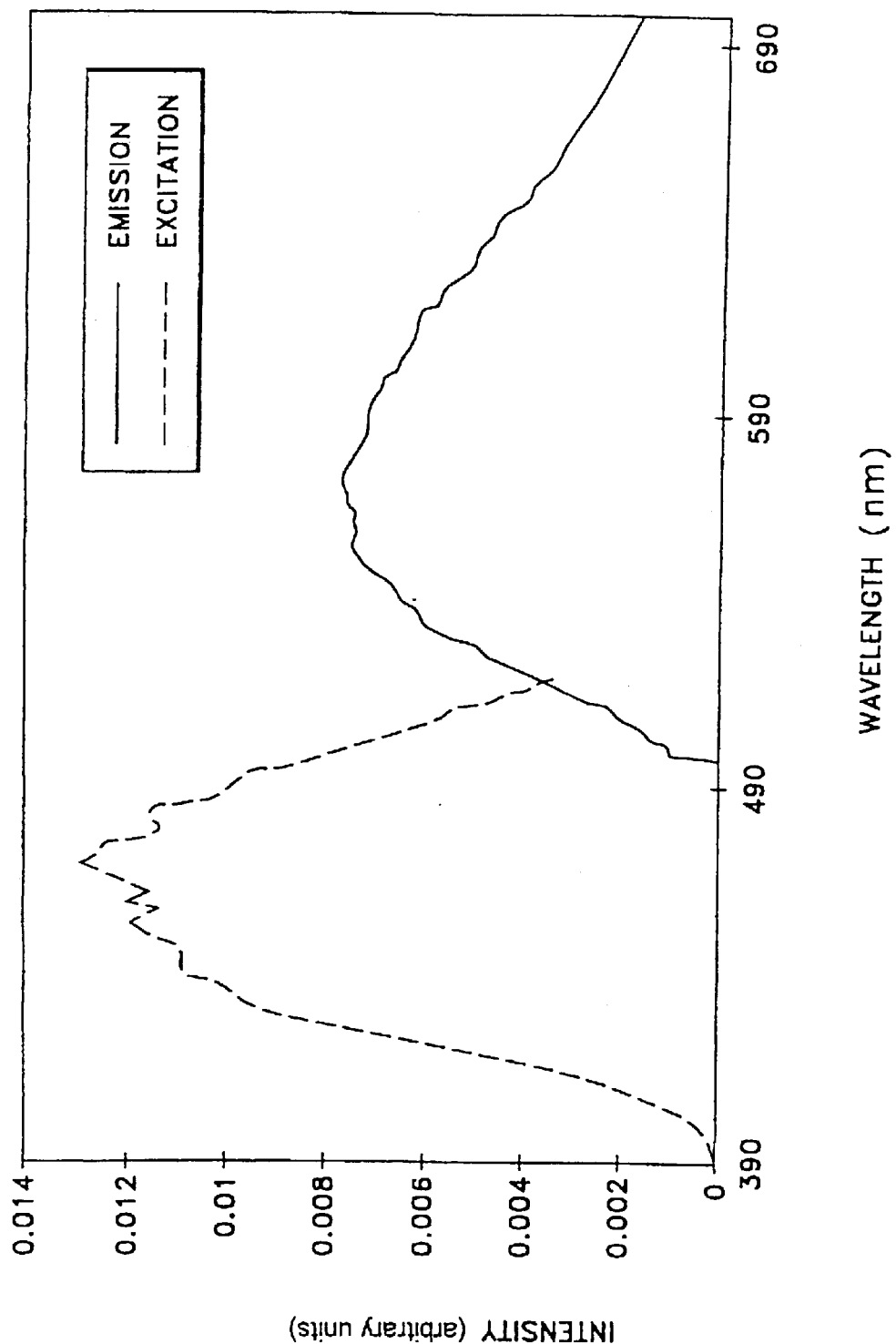
FIG. 2 shows the absorption and PL spectra of the yttrium aluminum oxide garnet phosphor doped with gadolinium and cerium.

At least one phosphor material is dispersed uniformly in the organic EL layer. The phosphor material is preferably of an inorganic type and is in the form of nanoparticles. The nanoparticles have a particle size distribution such that more than 95 percent of the particles have the largest dimension less than 100 nm, preferably less than 50 nm, and most preferably less than 30 nm. The smaller particle size is preferred because the particles will disperse well in the organic medium and the resulting organic EL layer would have a smoother surface. The phosphor nanoparticles may be prepared from larger pieces of phosphor material by any grinding or pulverization method, such as ball milling using zirconia toughened balls or jet milling. They also may be prepared by crystal growth from solution, and their size may be controlled by terminating the crystal growth at an appropriate time. The preferred phosphor materials efficiently absorb EM radiation emitted by the organic EL material in the ultraviolet-to-blue spectral region (i.e., wavelengths in the range from 100 nm to about 480 nm, preferably from about 350 nm to about 450 nm) and re-emit light in the blue-to-red spectral region (i.e., wavelength in the range from about 450 nm to about 770 nm). A particular phosphor material may be chosen to emit a desired color. A mixture of phosphors such as those emitting blue, green, and red light may be used if a white light is desired. An exemplary phosphor is the cerium-doped yttrium aluminum oxide $Y_3Al_5O_{12}$ garnet ("YAG"). Other suitable phosphors are based on YAG doped with more than one type of rare earth ions, such as $(Y_{1-x-y}Gd_xCe_y)_3Al_5O_{12}$ ("YAG:Gd,Ce"), $(Y_{1-x}Ce_x)_3(Al_{1-y}Ga_y)O_{12}$ ("YAG:Ga,Ce"), $(Y_{1-x-y}Gd_xCe_y)(Al_{5-z}Ga_z)O_{12}$ ("YAG:Gd,Ga,Ce"), and $(Gd_{1-x}Ce_x)Sc_2Al_3O_{12}$ ("GSAG") where $0 \leq x \leq 1$, $0 \leq y \leq 1$, $0 \leq z \leq 5$ and $x+y \leq 1$. For example, FIG. 2 shows the emission PL spectrum of the YAG:Gd,Ce phosphor. This material shows an absorption of light in the wavelength range from about 390 nm to about 530 nm (i.e., the blue spectral region) and an emission of light in the wavelength range from about 490 nm to about 700 nm (i.e., the green-to-red spectral region). The following are examples of phosphors that are efficiently excited by EM radiation emitted in the wavelength region of 300 nm to about 500 nm by polysilanes and their derivatives.

Green-emitting phosphors: $Ca_8Mg(SiO_4)_4Cl_2:Eu^{2+}$, $Mn^{2+}$; $GdBO_3:Ce^{3+}$, $Tb^{3+}$; $CeMgAl_{11}O_{19}$: $Tb^{3+}$; $Y_2SiO_5:Ce^{3+},Tb^{3+}$; and $BaMg_2Al_{16}O_{27}:Eu^{2+},Mn^{2+}$;

Red-emitting phosphors: $Y_2O_3:Bi^{3+}Eu^{3+}$; $Sr_2P_2O_7:Eu^{2+}$, $Mn^{2+}$; $SrMgP_2O_7:Eu^{2+},Mn^{2+}$; $(Y,Gd)(V,B)O_4:Eu^{3+}$; and $3.5MgO.0.5MgF_2.GeO_2$: $Mn^{4+}$;

Blue-emitting phosphors: $BaMg_2Al_{16}O_{27}:Eu^{2+}$ and $Sr_5(PO_4)_{10}Cl_2:Eu^{2+}$ Still other ions may be incorporated into the phosphor to transfer energy from the light emitted from the organic material to other activator ions in the phosphor host lattice as a way to increase the energy utilization. For example, when $Sb^{3+}$ and $Mn^{2+}$ ions exist in the same phosphor lattice, $Sb^{3+}$ efficiently absorbs light in the blue region, which is not absorbed very efficiently by $Mn^{2+}$, and transfers the energy to $Mn^{2+}$ ion. Thus, a larger total amount of light emitted by the organic EL material is absorbed by both ions, resulting in higher quantum efficiency of the total device.

The phosphor nanoparticles are dispersed in the organic EL film-forming material. A phosphor composition of less than about 30, preferably less than about 10, percent by volume of the mixture of organic material and phosphor is used. A solvent may be added into the mixture to adjust the viscosity of the organic material to a desired level. The mixture of the organic EL material and phosphor nanoparticles is applied by conventional techniques such as spin coating, spray coating, dip coating, roller coating, or ink-jet printing on the anode thin film that has been formed on the substantially transparent substrate. Spin coating is the preferred method when the mixture does not have very high viscosity. However, when it is desired to form the organic EL material on many small areas, the ink-jet printing method may be preferred.

Figure 3:
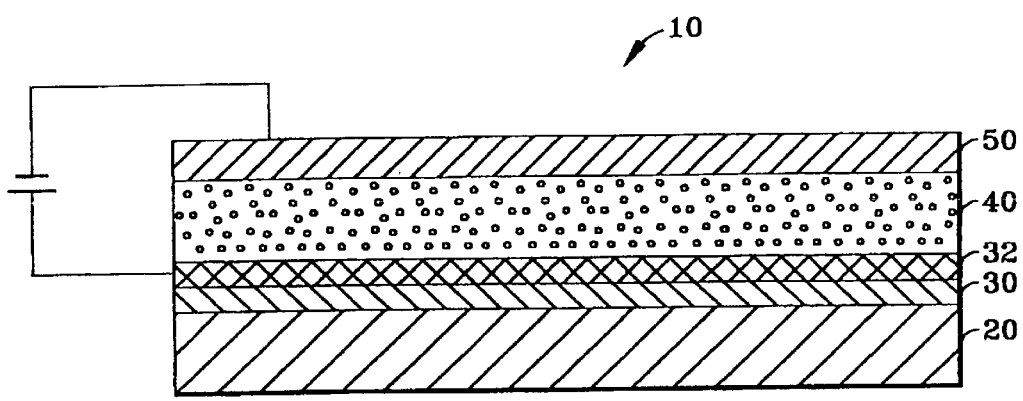
FIG. 3 is a schematic diagram of a four-layer organic light-emitting device of the present invention.

In addition to the anode, organic EL, and the cathode layers, one or more additional layers may be included to increase the efficiency of the overall device. For example, these additional layers can serve to improve the injection (electron or hole injection enhancement layers) or transport (electron or hole transport layers) of charges into the organic EL layer. The thickness of each of these layers is kept to below 500 nm, preferably below 100 nm. Materials for these additional layers are typically low-to-intermediate molecular weight (less than about 2000) organic molecules. They may be applied during the manufacture of the OLED by conventional methods such as spin coating, spray coating, dip coating, roller coating, ink-jet-printing, or physical or chemical vapor deposition. In another embodiment of the present invention, as shown schematically in FIG. 3, a hole injection enhancement layer 32 is formed between the anode layer 30 and the organic EL layer 40 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9,10-perylenetetra-carboxylic dianhydride or bis(1,2,5-thiadiazolo)-p-quinobis(1,3-dithiole).

Figure 4:
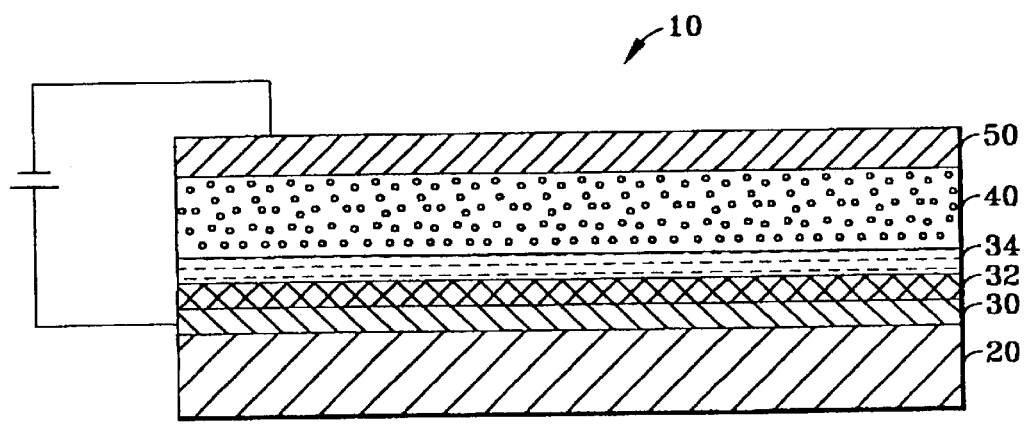
FIG. 4 is a schematic diagram of a five-layer organic light-emitting device of the present invention.

In another embodiment of the present invention, as shown schematically in FIG. 4, the OLED 10 further includes a hole transport layer 34 which is disposed between the hole injection enhancement layer 32 and the organic EL layer 40. The hole transport layer 34 has the functions of transporting holes and blocking the transportation of electrons so that holes and electrons are optimally combined in the organic EL layer. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Figure 5:
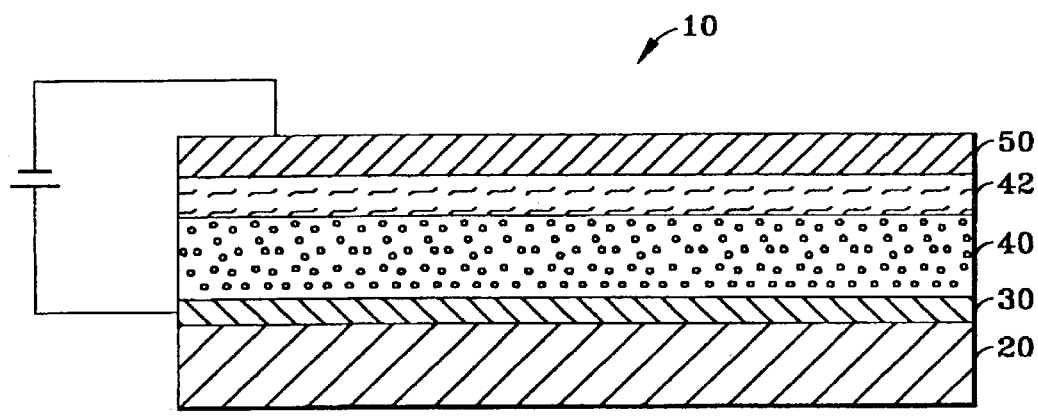
FIG. 5 is a schematic diagram of another embodiment of a four-layer organic light-emitting device of the present invention.

In still another embodiment of the present invention, as shown schematically in FIG. 5, the OLED 10 includes an additional layer 42 which is disposed between the cathode layer 50 and the organic EL layer 40. Layer 42 has the combined function of injecting and transporting electrons to the organic EL layer. Materials suitable for the electron injecting and transporting layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371.

When one or more additional layers other than the organic EL layer are included in the OLED, such as for hole injection enhancement, hole transport, electron injection enhancement and transport, nanoparticles of one or more phosphors disclosed above may be dispersed therein. An exemplary purpose for such an inclusion of phosphor nanoparticles is to further tune the color of the light emitted from the OLED.

Figure 6:
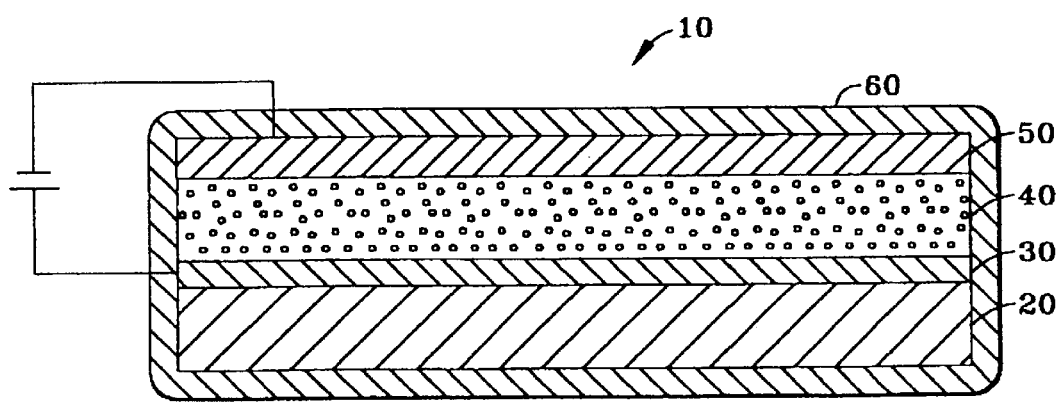
FIG. 6 is a schematic diagram of the OLED of the present invention encapsulated in a protective shell.

In still another embodiment of the present invention, as shown schematically in FIG. 6, the complete OLED 10 may be encapsulated in a substantially transparent and thin shell 60 of a polymeric material to retard the negative impact of oxygen and/or moisture on the useful life of the OLED 10. This shell may be formed by any conventional technique such as spray coating, dip coating, or chemical vapor deposition, followed by curing. The shell preferably has a thickness less than about 100 nm after curing. Although the OLED 10 shown in FIG. 6 includes only the substrate, the anode, the organic EL layer, and the cathode, it should be appreciated that any or all of the hole injection enhancement layer, the hole transport layer, and the electron injection enhancement and transport layer also may be included before the formation of the protective shell 60.

Figure 7:
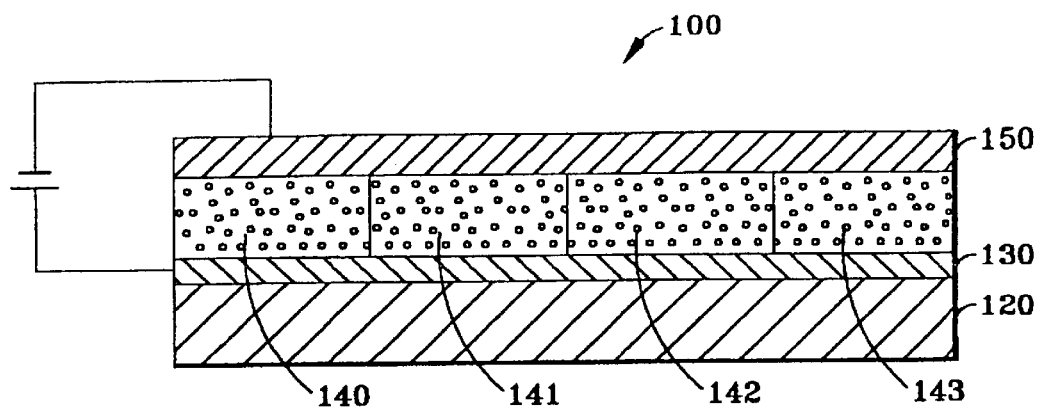
FIG. 7 is a schematic diagram of a first embodiment of a flat panel display of the present invention.
Figure 8:
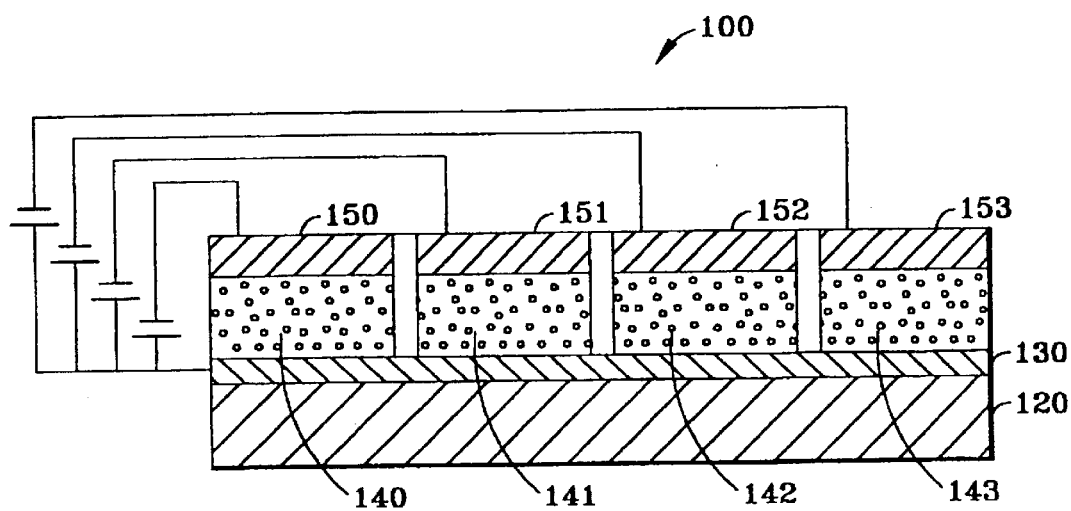
FIG. 8 is a schematic diagram of a second embodiment of a flat panel display of the present invention.

One or more OLEDs of the present invention may be included in a light-emitting flat panel display. The completed OLEDs may be attached to a common substrate or the layers of the individual OLEDs may be formed directly on defined areas of the common substrate. Each OLED or group of OLEDs may be provided with its own electrical power source, and the energization of different OLEDs or groups of OLEDs with respect to the schedule or level of the power applied may be controlled by a controller. An example is shown in FIG. 7. A flat panel color display 100 comprises a substantially transparent substrate 120 on which a thin anode layer 130 is formed. This anode layer is typically made of transparent ITO. In a preferred embodiment, a plurality of pixels (e.g., 140–143) of organic EL materials, each having one or more types of phosphor nanoparticles dispersed therein, is deposited on the anode layer at distinct positions. The organic EL materials are preferably applied by the inkjet printing method. This technique provides an inexpensive method of depositing the organic EL materials in very fine pixels. Alternatively, larger objects or figures may be formed, for example, by spray coating or printing. The thickness of each individual EL pixel, object, or figure may vary to provide the optimum brightness and appearance of the display. The pixels, objects, or figures may be deposited adjacently to one another to form a continuous layer. It may be desirable, in certain circumstances, to provide a partition between two adjacent pixels, objects, or figures. In this case, the partition is desirably made of an organic EL material that is different from the organic EL materials of the adjacent pixels, objects, or figures. In other circumstances, the partition may be desirably made of an organic material that is not electroluminescent. More than one layer of phosphor-dispersed organic EL material may be formed one on top of another to achieve the object of the display. A common cathode layer 150 is deposited on the exposed surface of the organic EL layer. In this case a common electrical power supplied is provided to the display. Alternatively, a separate cathode pixel or region may be deposited on each separate organic EL pixel or region as denoted by numerals 150–153 in FIG. 8. A convenient method of applying the separate cathode pixels or regions is by employing successive masks with the desired patterns. When one mask is applied, the cathode pixels are formed at the openings in the mask. Another mask is subsequently applied to form cathode pixels on other organic EL pixels. When separate cathode pixels or regions are formed, insulating partitions are preferably provided between them, and a separate power supply may be provided to each individual OLED which comprises the anode, the individual organic EL pixel or region, and the corresponding cathode pixel or region directly adjacent to it. In addition, additional layers for hole injection enhancement, hole transport, and electron injection enhancement and transport may be include as disclosed above. The various preferred materials disclosed in the foregoing are equally applicable to the manufacture of the flat panel display.

In another embodiment of the present invention, a white-light source is produced by integrating a plurality of light-emitting devices, each emitting one of blue, green, or red color. The individual OLEDs are arranged adjacently on a substantially transparent substrate such that two adjacent OLEDs emit two different colors. Preferably, the OLEDs are arranged in a matrix of rows and columns such that the OLEDs of each row or column form a periodic light color pattern; e.g., blue-green-red. In this way, the lights emitted by adjacent OLEDs are mixed to produce a white light.

Methods of producing OLEDs, panel displays, and large-area light sources of the present invention are now described.

A substantially transparent substrate piece such as glass is provided. The substrate piece may be previously cleaned with a compatible liquid, such as a dilute acid solution, and dried in a clean environment. An anode material, such as ITO, is sputter-deposited on the substrate piece to form an anode layer. The anode layer may be patterned further by etching. Preferably, the anode pattern is provided with an area from which a connection to an electrical voltage source may be made. The organic EL material is mixed with a desired amount of nanoparticles of at least one chosen PL material to produce a well-dispersed mixture. A quantity of a compatible solvent may be added to the mixture to adjust its viscosity to a desired level for ease of application on the anode. The solvent is preferably an organic solvent having high a vapor pressure such that it can be easily removed from the organic EL layer after it has been formed. Suitable solvents are acetone, low molecular weight alcohols, cyclohexane, toluene, or xylene. When the desired EL material is a polymeric material, monomers or oligomers of the polymeric material may be used in the mixture and a further polymerization of the monomers or oligomers may be carried out after the film has been formed. The mixture is deposited on the anode by any conventional method such as spin coating, spray coating, dip coating, roller coating, or ink-jet printing. Spin coating and ink-jet printing are preferred. The partially formed device at this stage may be dried at a low temperature, preferably under a sub-atmospheric pressure. The organic EL material may require a polymerization by an appropriate initiation. For example, EM radiation having an appropriate wavelength, such as in the UV range, or heat may complete the polymerization process. In other instances, a soluble polymerization catalyst may be provided in the mixture before the film is formed. In still other instances, the catalyst may be applied on the organic EL layer to initiate the polymerization, for example, by spraying. When a catalyst is used for the polymerization, it may be removed and the partially completed device may be dried in a clean environment. The cathode layer is next formed by sputter-depositing the cathode material, from one or more sources, on the organic EL layer. An electrical lead is attached to the cathode layer for a connection to the lower electrical potential of the voltage source. The device may be further encapsulated in a thin shell of a substantially transparent polymer. The shell may be formed by dip coating and curing the polymer. When additional layers of hole injection enhancement and transport material or electron injection enhancement and transport material are included in the OLED, they may be applied on the appropriate previously-formed layer by spin coating, spray coating, dip coating, roller coating, or ink-jet printing. The preferred method is ink-jet printing.

Figure 9:
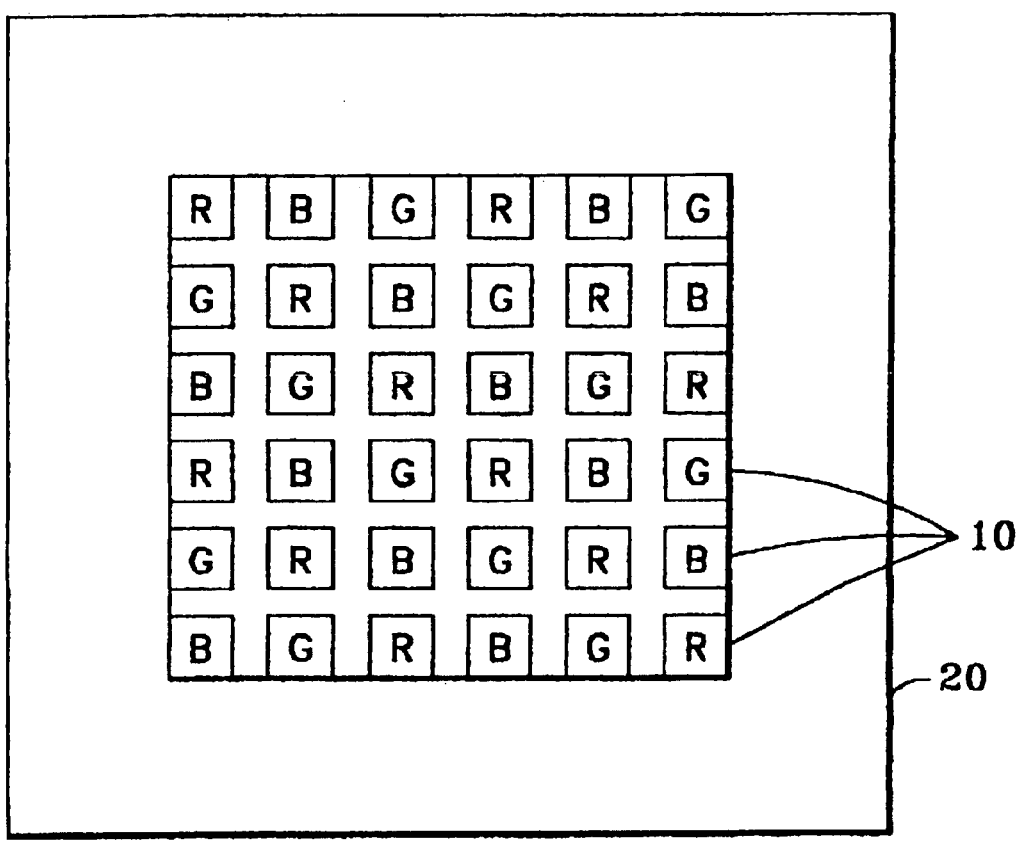
FIG. 9 is a schematic diagram of an arrangement of the OLEDs to form a white light source.

A plurality of the OLEDs thus made may be integrated together on a large-area transparent substrate to form a panel display or a light source for general lighting purposes. The individual OLEDs are attached to the substrate in a desired pattern with a thin layer of adhesive, such as a thermoplastic material or an epoxy resin. To produce a large-area white light source, a plurality of OLEDs 10 are preferably attached on the substrate 20 with a layer of adhesive in a matrix of rows and columns. The OLEDs are arranged such that two adjacent OLEDs 10 emit two different light colors selected from blue ("B"), green ("G"), and red ("R"); and the OLEDs 10 form a periodic pattern of colors, such as blue-green-red. FIG. 9 shows an example of such an arrangement. Alternatively, one single anode layer may be deposited on the substrate. Then the individual organic EL materials having nanoparticles dispersed therein are deposited on the anode layer in the desired pattern by ink-jet printing. Partitions of a non-conductive organic material are the deposited between the EL materials by, for example, ink-jet printing or chemical vapor deposition through an applied mask. Individual cathodes are then deposited on each individual organic EL material with non-conductive partitions provided between them. The cathodes in this case may be deposited by the conventional photolithography method.

While specific preferred embodiments of the present invention have been described in the foregoing, it will be appreciated by those skilled in the art that many modifications, substitutions, or variations may be made thereto without departing from the spirit and scope of the invention as defined in the appended claims.

What is claimed is:

1. A light-emitting device comprising:
   an anode disposed on a substantially transparent substrate;
   a hole injection enhancement material disposed on the anode and opposite the substrate;
   a hole transport material disposed on the hole injection enhancement material and opposite the anode;
   at least one organic EL material disposed on the hole transport material and opposite the hole injection enhancement material, the organic EL material having a plurality of nanoparticles of at least one inorganic PL material dispersed therein, the organic EL material emitting a first EM radiation having a first spectrum in response to an applied electrical voltage if the electrical voltage is applied through the anode and the cathode, and the inorganic PL material absorbing a portion of the first EM radiation having the first spectrum and emitting a second EM radiation having a second spectrum;
   an electron injection enhancement and transport material disposed on the organic EL material and opposite the hole transport material; and
   a cathode.

2. The light-emitting device of claim 1 further comprising at least an additional PL material dispersed in the hole injection enhancement material.

3. The light-emitting device of claim 1 further comprising at least an additional PL material dispersed in the hole transport material.

4. The light-emitting device of claim 1 further comprising at least an additional PL material dispersed in the electron injection enhancement and transport material.

5. The light-emitting device of claim 1 wherein
   the substrate comprises a material selected from the group consisting of glass, quartz, polycarbonate, silicone, polyacrylate, and epoxy resin;
   the anode is selected from the group consisting of indium tin oxide, tin oxide, indium oxide, zinc oxide, indium zinc oxide, and mixtures thereof;

the hole injection enhancement material is selected from the group consisting of 3,4,9,10-perylenetetra-carboxylic dianhydride, bis(1,2,5-thiadiazolo)-p-quinobis(1,3-dithiole), and mixtures thereof;

the hole transport material is selected from the group consisting of 3,4,9,10-perylenetetra-carboxylic dianhydride, bis(1,2,5-thiadiazolo)-p-quinobis(1,3-dithiole), and mixtures thereof;

the organic EL material comprises a material selected from the group consisting of poly(N-vinylcarbazole), poly(alkylfluorene), poly(paraphenylene), polysilane, 1,3,5-tris[N-(4-diphenylaminophenyl)phenylamino]benzene, anthracene, phenylanthracene, tetraarylethene, coumarin, rubrene, tetraphenylbutadiene, perylene, coronene, aluminum acetoacetonate, gallium acetoacetonate, indium acetoacetonate, scandium acetoacetonate, aluminum alkylphenoxide, gallium alkylphenoxide, indium alkylphenoxide, scandium alkylphenoxide, derivatives thereof, and mixtures thereof;

the inorganic PL material is selected from the group consisting of yttrium aluminum oxide garnet $Y_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_xCe_y)(Al_{5-z}Ga_z)O_{12}$; $(Gd_{1-x}Ce_x)Sc_2Al_3O_{12}$; wherein $0 \leq x \leq 1$, $0 \leq y \leq 1$, $0 \leq z \leq 5$ and $x+y \leq 1$; $Ca_8Mg(SiO_4)_4Cl_2:Eu^{2+},Mn^{2+}$; $GdBO_3:Ce^{3+}, Tb^{3+}$; $CeMgAl_{11}O_{19}$; $Tb^{3+}$; $Y_2SiO_5:Ce^{3+},T^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+},Mn^{2+}$; $SrMgP_2O_7:Eu^{2+},Mn^{2+}$; $(Y,Gd)(V,B)O_4:Eu^{3+}$; $3.5MgO.0.5MgF_2.GeO_2$: $Mn^{4+}$; $BaMg_2Al_{16}O_{27}:Eu^{2+}$; and $Sr_5(PO_4)_{10}Cl_2:Eu^{2+}$;

the electron injection enhancement and transport material is selected from the group consisting of tris(8-quinolinolato)aluminum, oxadiazole derives, quinoline derivatives, quinoxaline derivatives, diphenylquinone derivatives, nitro-substituted fluorene derivatives, and mixtures thereof; and the cathode is selected from the group consisting of K, Li, Na, Mg, La, Ce, Ca, Sr, Ba, Al, Ag, In, Sn, Zn, Zr, alloys thereof, and mixtures thereof.

6. The light-emitting device of claim 1 wherein the substrate is made of glass;

the anode is made of indium tin oxide the hole injection enhancement material is 3,4,9,10-perylenetetra-carboxylic dianhydride;

the hole transport material is 3,4,9,10-perylenetetra-carboxylic dianhydride;

the organic EL material is selected from the group consisting of poly(N-vinylcarbazole), poly(alkylfluorene), and polysilane;

the inorganic PL material is yttrium aluminum oxide garnet $Y_3Al_5O_{12}$;

the electron injection enhancement and transport material is tris(8- quinolinolato)aluminum; and the cathode is an alloy of Al—Mg.

7. A light-emitting panel display comprising a plurality of light-emitting devices, said plurality of light-emitting devices is attached to a substantially transparent panel, each of said light-emitting device comprising:

an anode;

a cathode; and at least one organic EL material disposed between the anode and the cathode, the organic EL material having a plurality of nanoparticles of at least one inorganic PL material dispersed therein, the organic EL material being capable of emitting a first EM radiation having a first spectrum in response to an electrical voltage applied through the anode and the cathode, and the PL material being capable of absorbing a portion of the first EM radiation and emitting a second EM radiation having a second spectrum.

8. A light-emitting panel display comprising a plurality of the light-emitting devices of claim 6, said plurality of light-emitting devices is attached to a substantially transparent panel.

9. A light-emitting panel display comprising a substantially transparent panel;

a common anode disposed on the panel;

a plurality of light-emitting objects disposed on the common anode and opposite the panel, each of the objects comprising at least one organic EL material having nanoparticles of at least one PL material dispersed therein, the organic EL material being capable of emitting a first EM radiation having a first spectrum in response to an applied electrical voltage, the PL material being capable of absorbing a portion of the first EM radiation and emitting a second EM radiation having a second spectrum; and at least one cathode disposed on the organic EL material and opposite the anode.

10. The light-emitting panel display of claim 9 wherein the panel comprises a material selected from the group consisting of glass, quartz, polycarbonate, silicone, polyacrylate, and epoxy resin;

the anode is selected from the group consisting of indium tin oxide, tin oxide, indium oxide, zinc oxide, indium zinc oxide, and mixtures thereof;

the organic EL material comprises a material selected from the group consisting of poly(N-vinylcarbazole) poly(alkylfluorene); poly(paraphenylene) polysilane; 1,3,5-tris[N-(4-diphenylaminophenyl)phenylamino]benzene; anthracene; phenylanthracene tetraarylethene; coumarin; rubrene; tetraphenylbutadiene perylene; coronene; aluminum acetoacetonate gallium acetoacetonate; indium acetoacetonate; scandium acetoacetonate; aluminum alkylphenoxide; gallium alkylphenoxide; indium alkylphenoxide; scandium alkylphenoxide; derivatives thereof; and mixtures thereof;

the PL material is selected from the group consisting of yttrium aluminum oxide garnet $Y_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_xCe_y)(Al_{5-z}Ga_z)O_{12}$; $(Gd_{1-x}Ce_x)Sc_2Al_3O_{12}$, wherein $0 \leq x \leq 1$, $0 \leq y \leq 1$, $0 \leq z \leq 5$ and $x+y \leq 1$; $Ca_8Mg(SiO_4)_4Cl_2:Eu^{2+},Mn^{2+}$; $GdBO_3:Ce^{3+}$, $Tb^{3+}$; $CeMgAl_{11}O_{19}$; $Tb^{3+}$; $Y_2SiO_5:Ce^{3+},T^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+},Mn^{2+}$; $SrMgP_2O_7:Eu^{2+},Mn^{2+}$; $(Y,Gd)(V,B)O_4:Eu^{3+}$; $3.5MgO.0.5MgF_2.GeO_2$: $Mn^{4+}$; $BaMg_2Al_{16}O_{27}:Eu^{2+}$; and $Sr_5(PO_4)_{10}Cl_2:Eu^{2+}$; and the cathode is selected from the group consisting of K, Li, Na, Mg, La, Ce, Ca, Sr, Ba, Al, Ag, In, Sn, Zn, Zr, alloys thereof, and mixtures thereof.

11. The light-emitting panel display of claim 9 wherein the substrate is made of glass;

the anode is made of indium tin oxide the organic EL material is selected from the group consisting of poly (N-vinylcarbazole), poly(alkylfluorene), and polysilane;

the PL is yttrium aluminum oxide garnet $Y_3Al_5O_{12}$; and the cathode is an alloy of Al—Mg.

12. The light-emitting panel display of claim 9 wherein each of said objects further comprising:

a hole injection enhancement material which is selected from the group consisting of 3,4,9,10-perylenetetra-carboxylic dianhydride, bis(1,2,5-thiadiazolo)-p-quinobis(1,3-dithiole), and mixtures thereof;

a hole transport material which is selected from the group consisting of 3,4,9,10-perylenetetra-carboxylic dianhydride, bis(1,2,5-thiadiazolo)-p-quinobis(1,3-dithiole), and mixtures thereof; and an electron injection enhancement and transport material which is selected from the group consisting of tris(8-quinolinolato)aluminum, oxadiazole derives, quinoline derivatives, quinoxaline derivatives, diphenylquinone derivatives, nitro-substituted fluorene derivatives, and mixtures thereof.

13. A light source emitting white light comprising a plurality of light-emitting devices that are arranged adjacently on a substantially transparent substrate such that two adjacent light-emitting devices emit two different colors selected from blue, green, and red, wherein each of the light-emitting devices comprises:

an anode;

a cathode; and at least one organic electroluminescent ("EL") material disposed between the anode and the cathode, the organic EL material having a plurality of nanoparticles of at least one PL material dispersed therein, the organic EL material being capable of emitting a first EM radiation having a first spectrum in response to an electrical voltage applied through the anode and the cathode, and the PL material being capable of absorbing a portion of the first EM radiation and emitting a second EM radiation having a second spectrum.

14. A light source emitting white light comprising a plurality of the light-emitting devices of claim 6, wherein the light-emitting devices are arranged adjacently on a substantially transparent substrate such that two adjacent light-emitting devices emit two different colors selected from blue, green, and red.

15. The light source of claim 13, wherein the light-emitting devices are arranged in a matrix of rows and columns, and each row or column forms a periodic pattern of sets of adjacent blue, green, and red colors.

* * * * *